(12) United States Patent
Ieda et al.

(10) Patent No.: US 7,091,823 B2
(45) Date of Patent: Aug. 15, 2006

(54) HUMAN BODY DETECTING DEVICE AND DOOR LOCKING DEVICE

(75) Inventors: Kiyokazu Ieda, Aichi-ken (JP); Yuichi Murakami, Aichi-ken (JP); Eiji Mushiake, Aichi-ken (JP)

(73) Assignee: Aisin Seiki Kabushiki Kaisha, Aichi ken (JP)

( * ) Notice: Subject to any disclaimer, the term of this patent is extended or adjusted under 35 U.S.C. 154(b) by 405 days.

(21) Appl. No.: 10/650,803

(22) Filed: Aug. 29, 2003

(65) Prior Publication Data

US 2004/0066294 A1   Apr. 8, 2004

(30) Foreign Application Priority Data

Aug. 29, 2002  (JP) .............................. 2002-250685

(51) Int. Cl.
*G06F 7/04* (2006.01)
(52) U.S. Cl. ............... 340/5.72; 340/562; 327/517; 307/10.2; 292/336.3
(58) Field of Classification Search ............... 340/5.72, 340/562; 326/517
See application file for complete search history.

(56) References Cited

U.S. PATENT DOCUMENTS

| | | | | |
|---|---|---|---|---|
| 5,880,538 A | * | 3/1999 | Schulz | .................. 307/109 |
| 6,075,294 A | * | 6/2000 | Van den Boom et al. | .. 340/562 |
| 6,657,537 B1 | * | 12/2003 | Hauler | ....................... 340/5.72 |
| 6,724,324 B1 | * | 4/2004 | Lambert | ..................... 340/562 |
| 2002/0125994 A1 | | 9/2002 | Sandau et al. | |
| 2003/0029210 A1 | * | 2/2003 | Budzynski et al. | ......... 70/278.1 |
| 2003/0101781 A1 | * | 6/2003 | Budzynski et al. | ............ 70/239 |
| 2003/0107473 A1 | | 6/2003 | Pang et al. | |

FOREIGN PATENT DOCUMENTS

| | | |
|---|---|---|
| EP | 1 211 649 A1 | 6/2002 |
| EP | 1 235 190 A1 | 8/2002 |
| JP | 2002-106214 A | 4/2002 |
| WO | WO 02/33203 A1 | 4/2002 |

OTHER PUBLICATIONS

Japanese Patent Paid-Open Publication No. 10(1998)-308149.

* cited by examiner

*Primary Examiner*—Brian Zimmerman
*Assistant Examiner*—Clara Yang
(74) *Attorney, Agent, or Firm*—Sughrue Mion, PLLC

(57) ABSTRACT

A human body detecting device includes a door handle provided on an outer panel, a first sensor electrode provided on the obverse side of the door handle, and a second sensor electrode provided on the reverse side of the door handle. The human body is detected in response to variation of capacitance between the outer panel and two sensor electrodes.

3 Claims, 6 Drawing Sheets

HUMAN BODY DETECTING DEVICE AND DOOR LOCKING DEVICE

This application is based on and claims priority to Japanese Patent Application No. 2002-250685 filed on Aug. 29, 2002, the entire content of which is incorporated herein by reference.

FIELD OF THE INVENTION

This invention relates to a human body detecting device and door locking device. More particularly, the present invention pertains to a human body detecting device and door locking device which detects human body approaching and contacting a door handle by variation of capacitance and locks/unlocks a vehicle door.

BACKGROUND OF THE INVENTION

With respect to a device for locking/unlocking a vehicle door without using a key, a device including a remote is known. For example, a sensor is provided in the vehicle door, the sensor recognizes human body approaching the vehicle. Further, communication between the remote and the vehicle is performed, the vehicle door is unlocked when an outside handle of the vehicle door is operated by human body equipped with a remote having an identification code corresponding to the vehicle. The vehicle door is locked by a switch provided on the vehicle door.

For example, a known human body detecting device is disclosed in a Japanese Patent Laid-Open Publication No. 10(1998)-308149. In the device, space is formed inside a resinous outside handle of a vehicle door, and parallel cables for detecting variation of capacitance are disposed in the space. Variation of capacitance between the parallel cables and variation of capacitance between one of the parallel cables and ground can be detected. Therefore, human body approaching the outside handle can be distinguished from human body contacting the outside handle by one sensor.

According to the above described known work, the human body approaching the outside handle can be distinguished from the human body contacting the outside handle. However, it is difficult to determine whether the human body intends to open the vehicle door or the human body intends to walk away from the vehicle door after closing the vehicle door.

Although multiple sensors or switches may be provided in order to detect whether the vehicle door is looked or unlocked, the cost increases and the vehicle doorway be accidentally unlocked.

The present invention therefore seeks to provide a human body detecting device and door locking device capable of distinguishing human body intending to open a vehicle door from the human body intending to close the vehicle door by one sensor and of locking/unlocking the vehicle door.

SUMMARY OF THE INVENTION

According to an aspect of the present invention, a human body detecting device includes a door handle provided on an outer panel, a first sensor electrode provided on the obverse side of the door handle, and a second sensor electrode provided on the reverse side of the door handle. The human body is detected in response to variation of capacitance between the outer panel and two sensor electrodes.

According to another aspect of the present invention, the first sensor electrode detects increase in the capacitance by the human body, and the second sensor electrode detects decrease in the capacitance by the human body.

According to still another aspect of the present invention, a door locking device includes a door handle provided on an outer panel of a vehicle door and a human body detecting device detecting that human body approaches or contacts the obverse side and reverse side of the door handle. The vehicle door is locked when the human body approaches or contacts the obverse side of the door handle and the vehicle door is unlocked when the human body approaches or contacts the reverse side of the door handle.

BRIEF DESCRIPTION OF THE DRAWINGS

The foregoing and additional features and characteristics of the present invention will become more apparent from the following detailed description considered with reference to the accompanying drawings in which like reference numerals designate like elements and wherein.

DETAILED DESCRIPTION OF THE INVENTION

Figure 1:
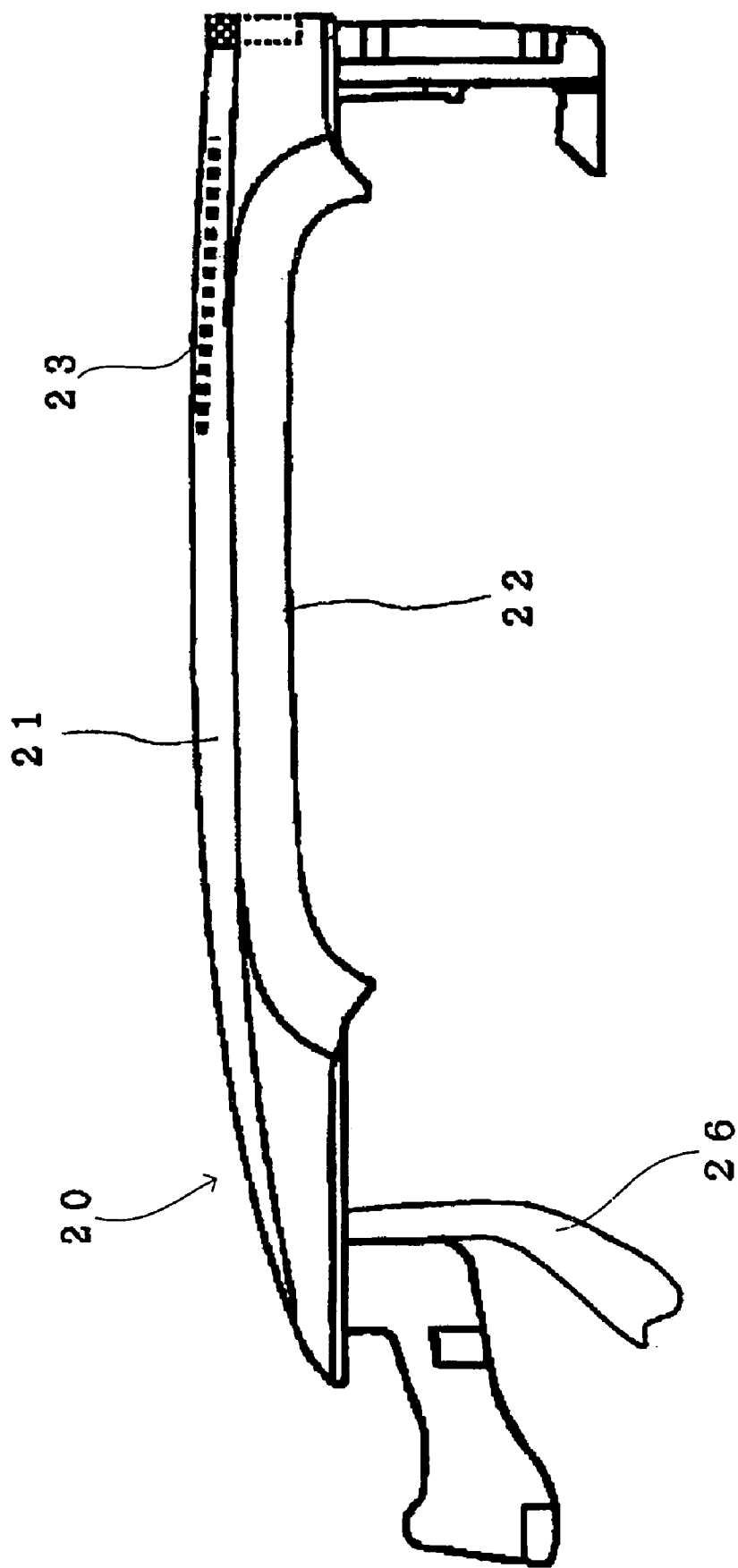
FIG. 1 illustrates a lateral view of an outside handle according to an embodiment of the present invention.

FIG. 1 shows an outside handle 20 (door handle) according to an embodiment of the present invention. The outside handle 20 is provided on a vehicle door (not shown, corresponding to after-mentioned outer panel 24).

In FIG. 1, a resinous cover 21 is provided on the obverse side of the outside handle 20, and a sensor electrode 23 (first sensor electrode) is provided inside the resinous cover 21. A sensor electrode 22 (second sensor electrode) is provided on the reverse side of the outside handle 20 so that a conductive part of the outside handle 20 can serve as the sensor electrode 22. Wire harness 26 is connected to the sensor electrode 22 and 23. For example, whole part of the outside handle 20 is made of resin, the sensor electrode 22 and the sensor electrode 23 may be respectively provided on the reverse side and the obverse side of the out side handle 20.

Figure 2:
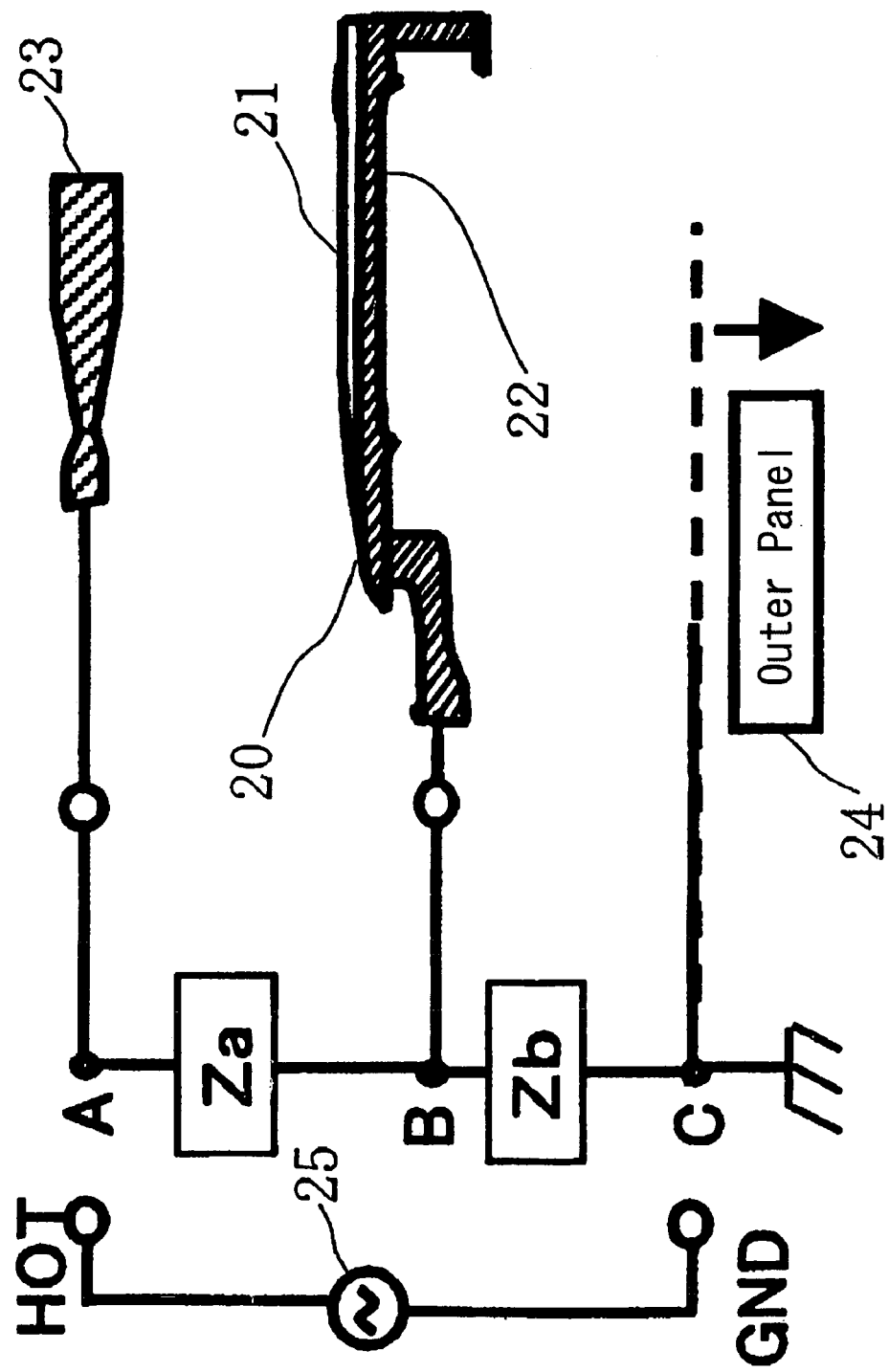
FIG. 2 illustrates a principle of the embodiment of the present invention.

FIG. 2 shows a principle of the present invention. When human body approaches the sensor electrode 23, capacitance between the sensor electrode 23 and the outer panel 24 varies (in this case, increases) corresponding to impedance Za 6 between the sensor electrode 23 and the sensor electrode 22 and impedance Zb between the sensor electrode 22 and the outer panel 24.

Figure 3:
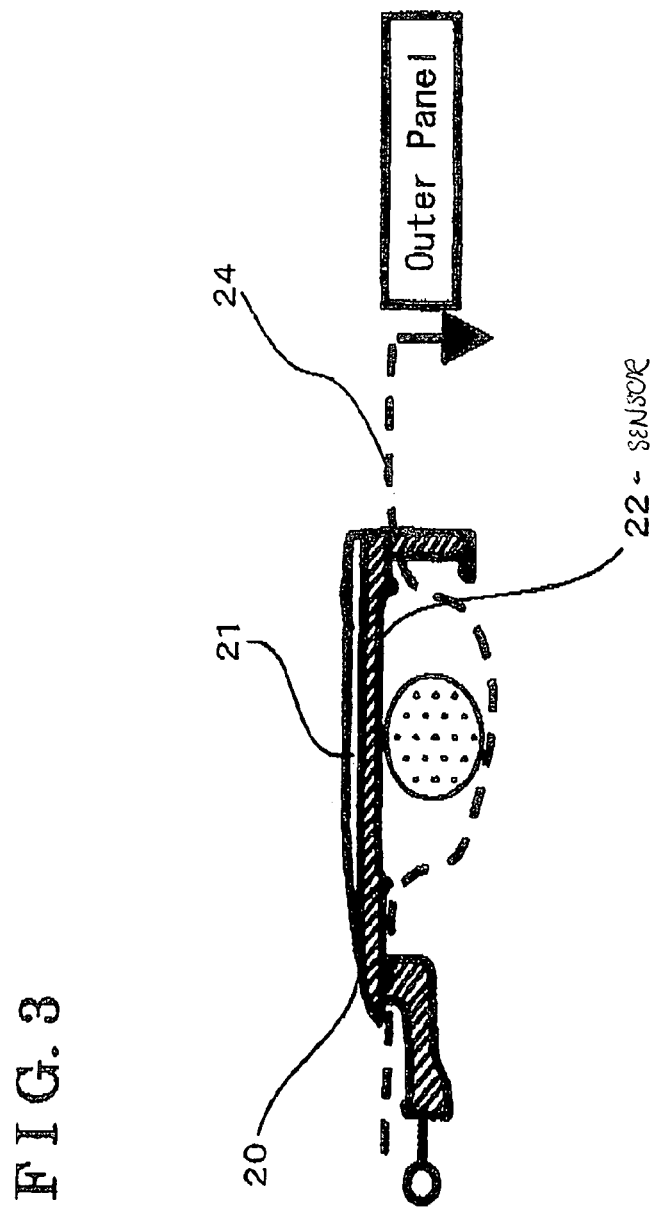
FIG. 3 illustrates a principle of the embodiment of the present invention.

Next, as shown in FIG. 3, when the human body is inserted between the outer panel 24 and the outside handle 20 (i.e. between the outer panel 24 and the sensor electrode 22) in order to open the vehicle door, capacitance between the outer panel 24 and the sensor electrode 22 is blocked by the human body, then capacitance varies. In this case, capacitance between the human body and the outer panel 24 is serially connected to the capacitance between the outer panel 24 and the sensor electrode 22, and then the capacitance decreases. Thus, the human body approaching or contacting the obverse side of the outside handle 20 can be distinguished from the human body approaching or contacting the reverse side of the outside handle 20 by detecting the variation of capacitance.

Door opening operation is detected by the sensor electrode 22 provided on the reverse side of the outside handle 20, and door closing operation is detected by the sensor electrode 23 provided on the obverse side of the outside handle 20. That is, the door opening operation can be distinguished from the door closing operation by one sensor. Accordingly, the vehicle door set to be automatically unlocked as the door opening operation is performed, and the vehicle door set to be automatically locked as the door closing operation is performed. Therefore, the vehicle door can be automatically and easily locked/unlocked without using a key and a remote. Further, the vehicle door can be surely locked. Additionally, the vehicle door is set to be locked/unlocked only when a receiving device provided in the vehicle recognizes an identification code corresponding to vehicle's owner, and only the vehicle's owner can lock/unlock the vehicle door.

As for a circuit for detecting the variation of capacitance, when a circuit in which voltage positively and negatively varies is applied, increase and decrease in the capacitance can be detected by one circuit, therefore a circuit for detecting the increase in the capacitance and a circuit for detecting the decrease in the capacitance need not to be separately provided.

Figure 4:
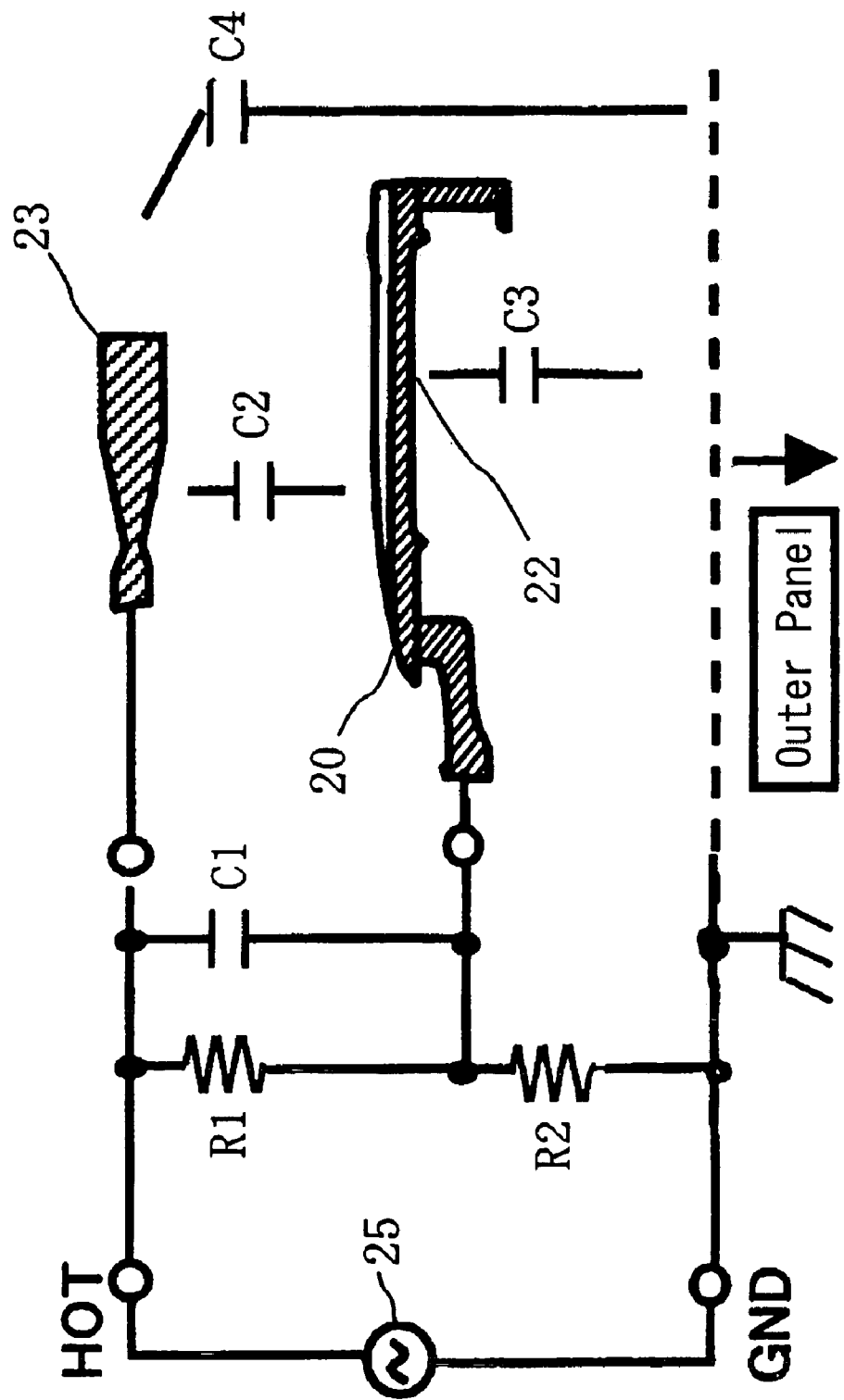
FIG. 4 is a circuit diagram of the embodiment of the present invention.

FIG. 4 shows an embodiment of the present invention. The impedance Za is a resistance R1 and a capacitor C1. The R1 is set to 300 kΩ and the C1 is set to 82 pF. Coupling capacitance (C2) between the sensor electrode 23 and the sensor electrode 22 is set to 15 pF. The impedance Zb is a resistance R2. The R2 is set to 13 kΩ. Coupling capacitance (C3) between the outer panel 24 and the sensor electrode 22 is set to 26 pF. A signaling device 25 applies alternating current between the sensor electrode 23 and the outer panel 24. (C4) means capacitance between the sensor electrode 23 and outer panel 24.

Figure 5:
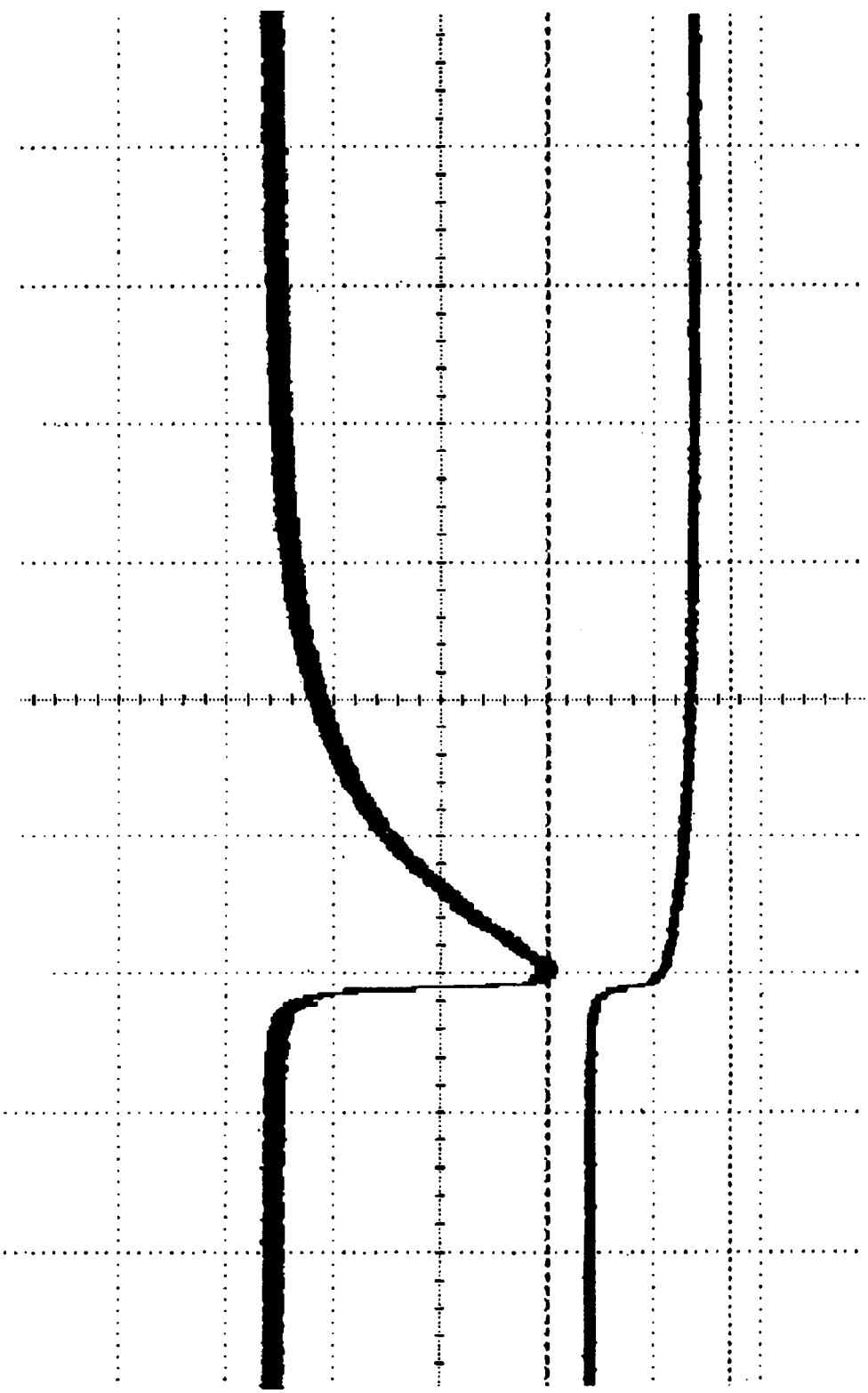
FIG. 5 illustrates waveform of voltage as human body approaches or contacts the obverse side of the outside handle.
Figure 6:
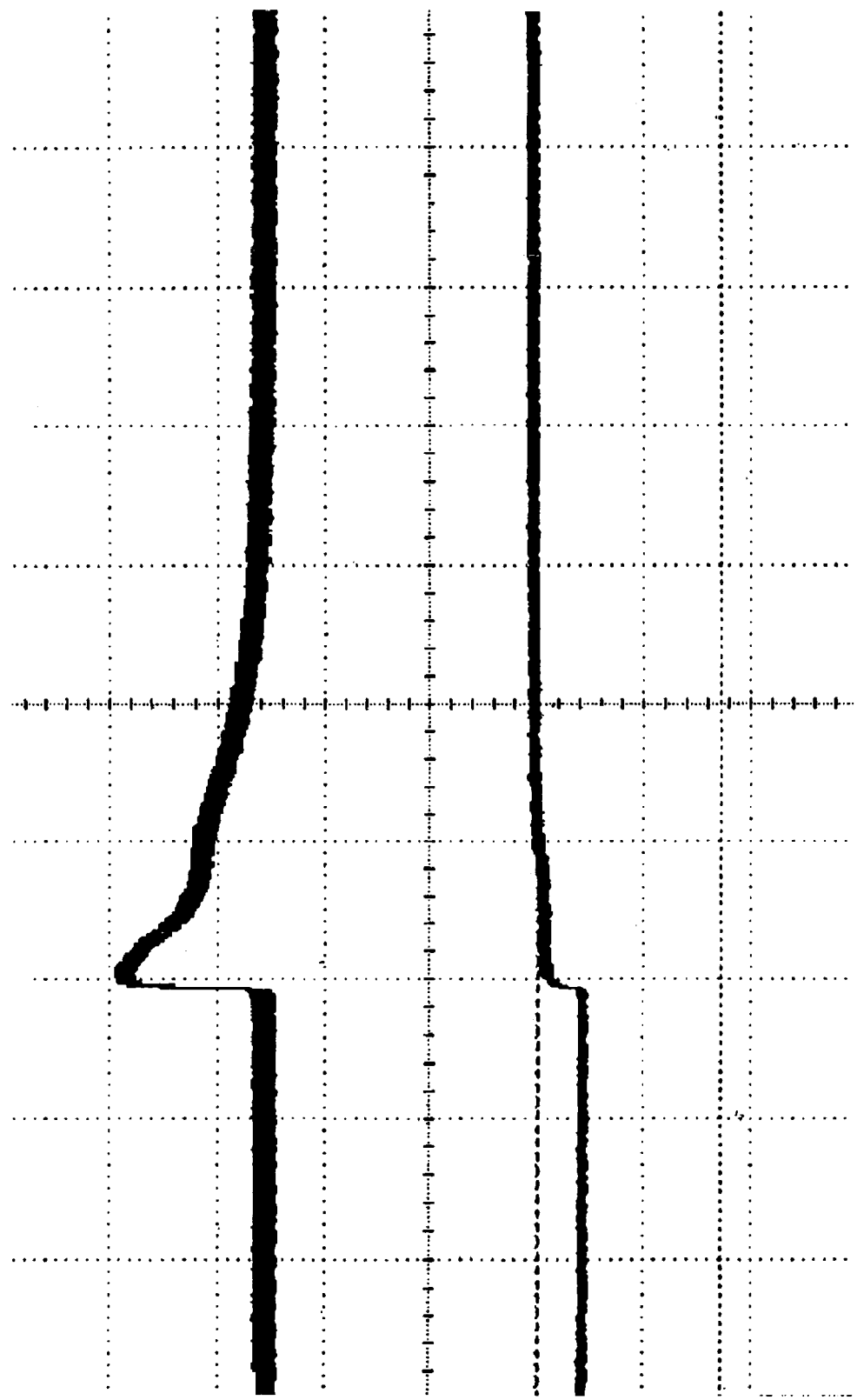
FIG. 6 illustrates waveform of voltage as human body approaches or contacts the reverse side of the outside handle.

FIG. 5 shows waveform of voltage as the human body approaches or contacts the obverse side of the outside handle 20. An upper waveform in FIG. 5 shows waveform of voltage corresponding to the variation of capacitance. In this case, the voltage is set to decrease corresponding to the increasing of capacitance. A lower waveform in FIG. 5 shows Lo-output as the voltage is below a predetermined threshold value. FIG. 6 shows waveform of voltage as the human body approaches or contacts the reverse side of the outside handle 20. An upper waveform in FIG. 6 shows waveform of voltage corresponding to the variation of capacitance. In this case, the voltage is set to increase corresponding to the decreasing of capacitance. A lower waveform in FIG. 6 shows Hi-output as the voltage is above a predetermined threshold value. That is, the variation of voltage is converted to the Lo-signal when the human body approaches or contacts the obverse side of the door handle 20, the variation of voltage is converted to the Hi-signal when the human body approaches or contacts the reverse side of the door handle 20, therefore, the door opening operation can be distinguished from the door closing operation.

According to the present invention, when the human body approaches or contacts the outside handle 20, the capacitance of the sensor electrode 22 and the capacitance of the sensor electrode 23 vary, then the human body which approaches or contacts the outside handle 20 can be detected. Whether the human body has gripped the outside handle 20 can be detected according to difference in the variation of capacitance of the sensor electrode 23 and the sensor electrode 22 of the outside handle 20. Therefore, the human body intending to open the vehicle door can be distinguished from the human body intending to close the vehicle door by one sensor.

According to the present invention, when the human body approaches or contacts the obverse side of the outside handle 20 in order to close the vehicle door, the vehicle door can be automatically locked. When the human body approaches or contacts the reverse side of the outside handle 20 in order to open the vehicle door, the vehicle door can be automatically unlocked.

The principles, preferred embodiments and mode of operation of the present invention have been described in the foregoing specification. However, the invention which is intended to be protected is not to be construed as limited to the particular embodiments disclosed. Further, the embodiments described herein is to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A human body detecting device, comprising: a door handle provided on an outer panel; a first sensor electrode provided on the obverse side of the door handle; a second sensor electrode provided on the reverse side of the door handle; a first impedance element provided between the first sensor electrode and the second sensor electrode; a second impedance element provided between the second sensor electrode and the outer panel; and a signaling device applying alternating current between the first sensor electrode and the outer panel.

2. A human body detecting device, according to claim 1, wherein the first sensor electrode detects increase in the capacitance by the human body, and the second sensor electrode detects decrease in the capacitance by the human body.

3. A door locking device, comprising: a door handle provided on an outer panel of a vehicle door; a human body detecting device detecting that human body approaches or contacts the obverse side and reverse side of the door handle, the human body detecting device comprising:
 a first sensor electrode provided on the obverse side of the door handle;
 a second sensor electrode provided on the reverse side of the door handle;
 a first impedance element provided between the first sensor electrode and the second sensor electrode;
 a second impedance element provided between the second sensor electrode and the outer panel; and
 a signaling device applying alternating current between the first sensor electrode and the outer panel,
 wherein the vehicle door is locked when the human body approaches or contacts the obverse side of the door handle and the vehicle door is unlocked when the human body approaches or contacts the reverse side of the door handle.

* * * * *